United States Patent [19]
Brossard

[11] Patent Number: 5,243,571
[45] Date of Patent: Sep. 7, 1993

[54] MEMORY BUS PRECHARGING CIRCUIT

[75] Inventor: Patrice Brossard, Paris, France

[73] Assignee: Bull S.A., Paris, France

[21] Appl. No.: 629,224

[22] Filed: Dec. 18, 1990

[30] Foreign Application Priority Data

Dec. 21, 1989 [FR] France ............... 89 16954

[51] Int. Cl.$^5$ .................................. G11C 7/00
[52] U.S. Cl. ..................... 365/203; 365/189.09;
 365/204; 365/230.06; 307/446; 307/480
[58] Field of Search .............. 365/203, 204, 189.09,
 365/230.06; 307/446, 480

[56] References Cited

U.S. PATENT DOCUMENTS

| | | | |
|---|---|---|---|
| 4,813,020 | 3/1989 | Iwamura et al. | 365/189 |
| 4,866,673 | 9/1989 | Higuchi et al. | 365/203 |
| 4,873,673 | 10/1989 | Hori et al. | 365/230.06 |
| 5,058,067 | 10/1991 | Kertis | 365/203 |
| 5,070,261 | 12/1991 | Ten Eyck | 307/446 |
| 5,103,113 | 4/1992 | Inui et al. | 365/203 |

FOREIGN PATENT DOCUMENTS

| | | | |
|---|---|---|---|
| 59-25423 | 2/1984 | Japan | 307/446 |
| 2028044 | 2/1980 | United Kingdom . | |
| 2070372 | 9/1981 | United Kingdom . | |

Primary Examiner—Joseph E. Clawson, Jr.
Attorney, Agent, or Firm—Weingarten, Schurgin, Gagnebin & Hayes

[57] ABSTRACT

A precharging circuit of a memory bus that includes a bipolar transistor driven by a clock signal wherein the base of the bipolar transistor is connected to both supply potentials through two respective complementary field effect transistors having their gates connected to the output of a threshold amplifier connected to the bus. The precharging circuit allows adjustment of the precharging voltage of a memory bus to a value predetermined during the precharging phase of the clock signal.

7 Claims, 2 Drawing Sheets

MEMORY BUS PRECHARGING CIRCUIT

FIELD OF THE INVENTION

The invention relates to an integrated-memory bus precharging circuit, and particularly to such precharging circuits that employ bipolar transistors and field effect transistors.

BACKGROUND OF THE INVENTION

Reading and writing in a memory cell are generally accomplished using at least one bus during the read and write phases included in a clock signal. At the present time, it is usual to precede the write phase and/or the read phase by a phase in which a bus is precharged. The precharging phases are incorporated into the clock signal. A single bus will be considered for convenience. The purpose of precharging is to set the bus at a predetermined potential, usually equal to a supply potential Vcc. Writing and reading are accomplished by maintaining the predetermined bus voltage or by discharging the bus, depending on the binary state to be written to or read from a memory cell. Precharging is ordinarily accomplished by at least one field effect transistor when the bus has a low capacitive value. However, rapid precharging of a bus that has a relatively high capacitive value, for example, greater than 1 pF, requires the use of a bipolar transistor. The collector of this transistor is connected to the high supply potential Vcc and its emitter is connected to the bus. Its base is connected to Vcc and to ground through the respective drain-source leads of two MOS transistors of complementary types receiving the clock signal at their gates. Outside the precharging phase, the MOS transistor connected to ground conducts to ensure discharging of the base of the bipolar transistor. The precharging phase blocks this transistor and causes the other MOS transistor to conduct. This MOS transistor creates a current path coming from the supply potential Vcc to command the bipolar transistor to conduct. The end of the clock signal precharging phase cuts the current path and causes the other MOS transistor to conduct and to discharge the base of the bipolar transistor.

The precharging circuit described above has several disadvantages. Precharging of the bus by this circuit normally stops when the precharging voltage is sufficiently close to the supply voltage Vcc to cut off the bipolar transistor or cause it to conduct slightly. Under these conditions, the precharging time will depend mainly on the capacitive value of the bus and on the conductance of the MOS transistor driven by the clock signal to supply the base of the bipolar transistor. It is well known that a field effect transistor can have a wide range of current/voltage characteristics as a function of manufacturing conditions, with a ratio as high as 1:3. As a result, a precharging circuit in the prior art allows for no adjustment of the precharging voltage and commanding its voltage by the length of the clock signal cannot be effective because of the wide range of the characteristics of the field effect transistor causing the supply current lead of the bipolar transistor base to conduct.

SUMMARY OF THE INVENTION

A precharging circuit of a memory bus is disclosed that includes a bipolar transistor driven by a clock signal wherein the base of the bipolar transistor is connected to both supply potentials through two respective complementary field effect transistors having their gates connected to the output of a threshold amplifier connected to the bus. The precharging circuit of the invention allows adjustment of the precharging voltage of a memory bus to a value predetermined during the precharging phase of the clock signal.

DESCRIPTION OF THE DRAWING

The invention will be more fully understood from the following detailed description, in conjunction with the accompanying figures, in which.

DETAILED DESCRIPTION OF THE INVENTION

Figure 1:
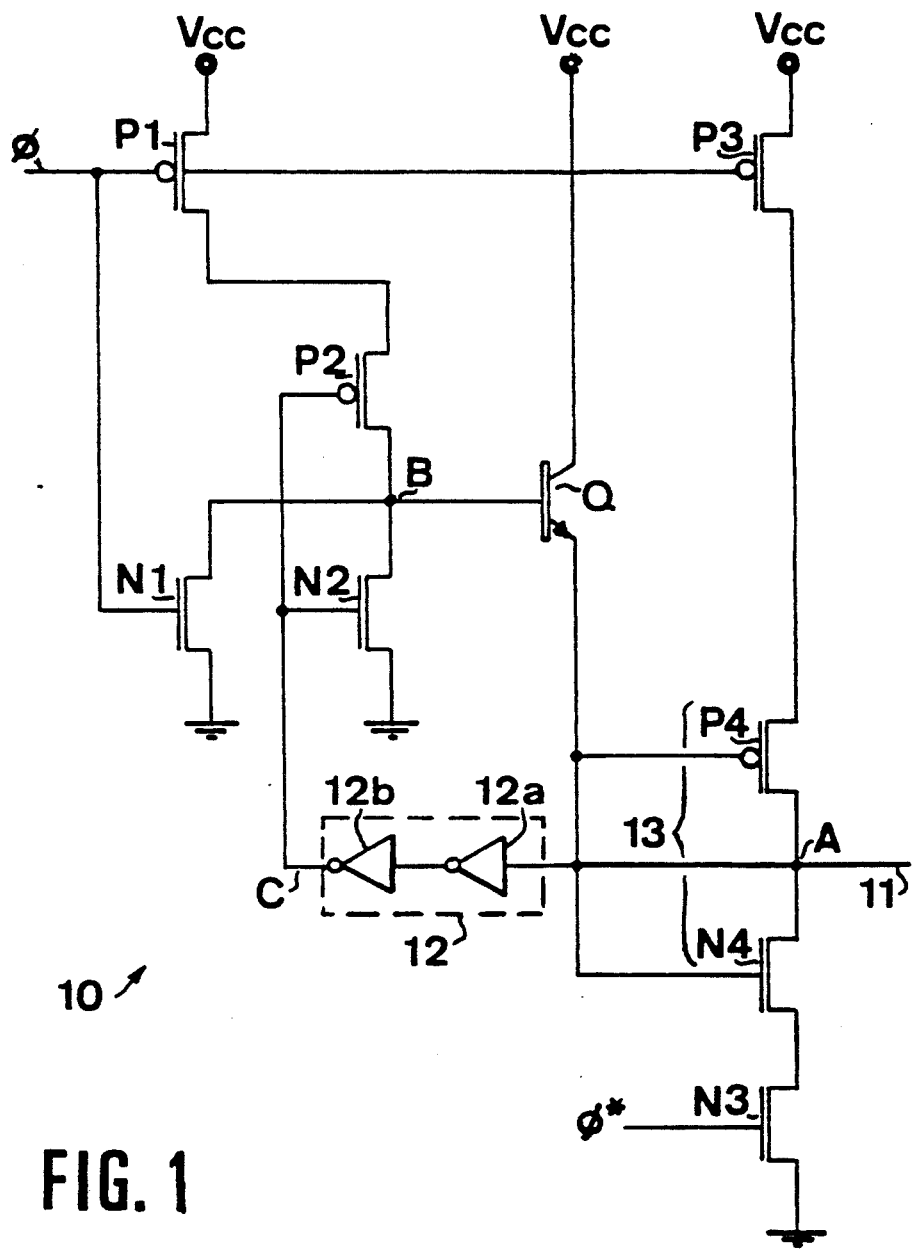
FIG. 1 is a schematic diagram of a precharging circuit according to the invention.

In FIG. 1, a precharging circuit 10 of a memory bus 11 includes a bipolar transistor Q driven by a clock signal $\phi$. The precharging circuit 10 employs BiCMOS technology. The n-MOS transistors are designated N and the p-MOS transistors are designated P. In the precharging circuit 10, the emitter of bipolar transistor Q is connected to bus 11 at a point A and its collector is connected to the supply potential Vcc. Its base constitutes point B of the precharging circuit 10. Clock signal $\phi$ is applied to the gates of the two transistors N1, P1. The drain of transistor P1 is connected to supply potential Vcc and its source is connected to point B. The source of transistor N1 is connected to ground and its drain is connected to point B.

According to the invention, base B of bipolar transistor Q is connected respectively to supply potential Vcc and to ground through the two transistors P2, N2 whose gates are connected to output C of a threshold amplifier 12 connected to the bus 11. In other words, the drain-source leads of the transistors P1 and P2 are connected in series between base B of bipolar transistor Q and supply potential Vcc, while the drain-source leads of transistors N1 and N2 are connected in parallel between the base B of bipolar transistor Q and ground. The threshold amplifier 12 includes two inverters 12a, 12b. The input of inverter 12a is connected to point A of bus 11 and has a threshold Ta. The input of inverter 12b is connected to the output of inverter 12a and has a threshold Tb.

Precharging circuit 10 also includes four transistors N3, P3, N4, P4 whose drain-source leads are connected in series between supply potential Vcc and ground. The source of transistor P3 is connected to potential Vcc and its gate receives clock signal $\phi$. The source of transistor N3 is connected to ground and its gate receives complementary clock signal $\phi^*$. The drains of transistors P4 and N4 meet at point A of bus 11. Their gates are common and also meet at point A of bus 11, so that transistors N4 and P4 constitute diodes. Their characteristic current/voltage curves relate to common abscissas (voltage) whose origins are, respectively, 0 volts and $V_{cc}$. The two characteristic curves of the two diodes intersect at a point whose abscissa determines the voltage at point A. The sizing of transistors N4 and P4 with respect to each other is determined such as to confer, on point A, the desired precharging potential Vp of bus 11. Transistors N4 and P4 thus form a polarization circuit 13.

Figure 2:
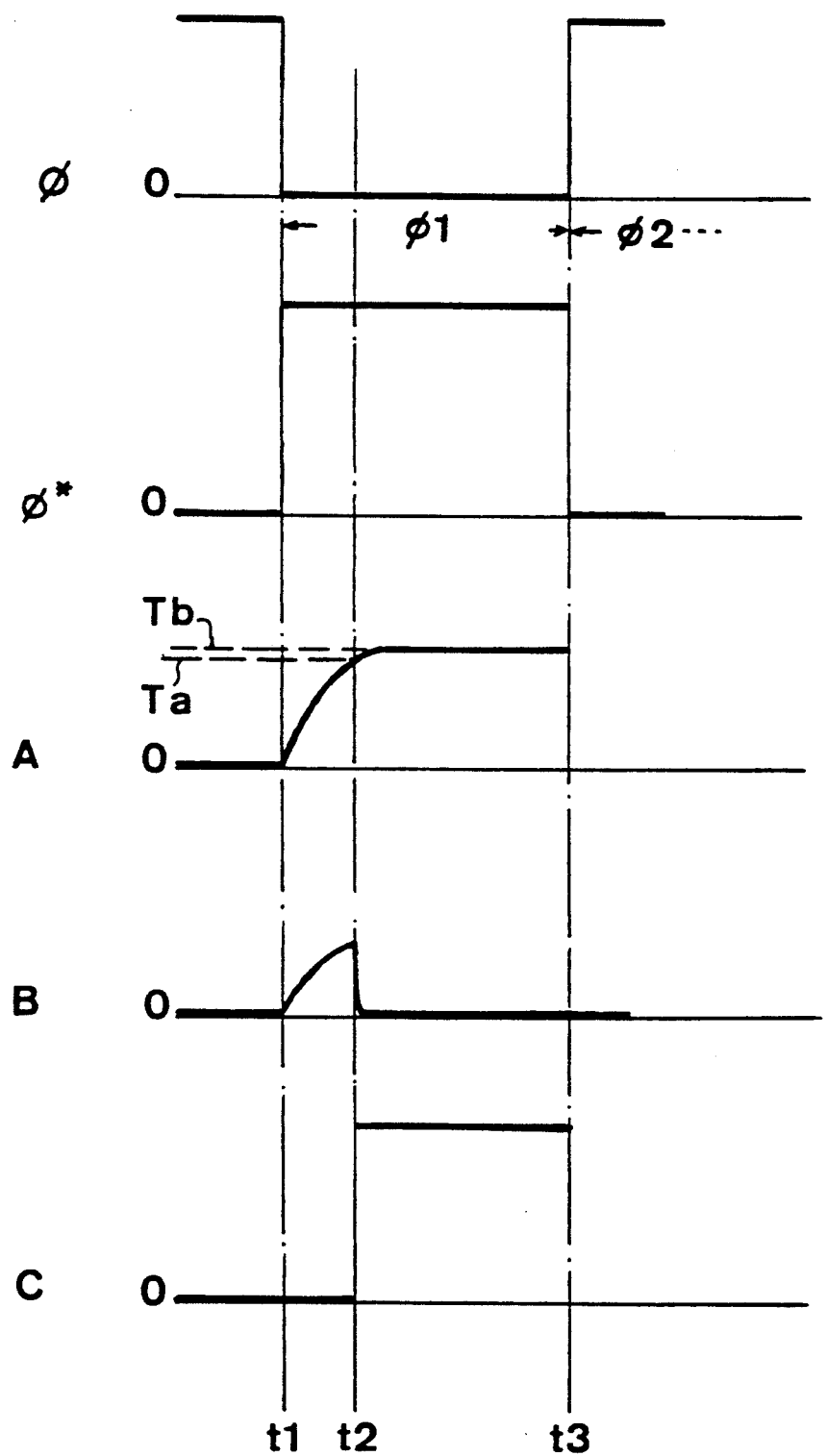
FIG. 2 shows different waveforms illustrating the operation of the precharging circuit of FIG. 1.

The operation of precharging circuit 10 will now be described with reference to the time chart of FIG. 2 illustrating waveforms of clock signals $\phi$ and $\phi^*$, and the signals at points A, B, and C of the precharging circuit 10. In the example illustrated, clock signal $\phi$ includes a precharging phase $\phi 1$ and an execution phase (write or read phase) $\phi 2$. The precharging phase $\phi 1$ starts at time t1. Before time t1, clock signal $\phi$ is in logic state 1. It will be assumed that logic state 1 corresponds to supply potential $Vcc = +5$ volts. Application of clock signal $\phi$ to precharging circuit 10 thus blocks transistors P1 and P3 and places transistor N1 in the conducting state. Blocking of transistor P1 prevents conduction of bipolar transistor Q. The conduction state of transistor N1 ensures discharge to ground of the charges accumulated on the base of bipolar transistor Q. As a result, the potential at point B is 0 volt. It will also be assumed that the potential at point A of bus 11 in the initial state is 0 volt. This potential is transmitted by amplifier 12 to point C, so that transistor N2 is blocked and transistor P2 is in the conducting state. However, it cannot conduct current because P1 is blocked.

At time t1, clock signal $\phi$ assumes logic state 0 corresponding to precharging phase $\phi 1$. Application of clock signal $\phi$ to precharging circuit 10 at time t1 places transistors P1 and P3 in the conducting state and blocks transistor N1. Conduction of transistors P1 and P2 and blocking of transistors N1 and N2 allow injection of a substantial current into the base of bipolar transistor Q. The high conductance of bipolar transistor Q rapidly raises the potential of point A of bus 11. It will be assumed that the desired precharging voltage Vp of bus 11 is equal to 2.5 volts. This being the case, it will be advantageous to confer on threshold Ta of inverter 12a of amplifier 12 a value slightly less than Vp: 2.3 volts, for example. Threshold Tb of inverter 12b will be higher than threshold Ta, preferably equal to Vp. Under these conditions, point C remains at 0 volt. Moreover, at time t1, transistors P3 and N3 become conductive. Hence, a current passing through transistors P3 and P4 thus charges bus 11. However, the charging of the bus through these transistors is substantially slower than that through transistor Q. At time t2, the potential of point A reaches the value of threshold Ta = 2.3 volts. At this value, the output of inverter 12 returns to the zero state. The potential at point C thus switches to +5 volts, so that transistor P2 is blocked and transistor N2 conducts. Conduction of bipolar transistor Q is hence interrupted suddenly at time t2. Polarization circuit 13 continues to charge bus 11 slowly. The sizes of transistors N4, P4 mounted as diodes are determined such that the voltage at point A is stabilized to the desired precharging voltage Vp = 2.5 volts. Polarization circuit 13 also prevents parasitic oscillations that could cause bipolar transistor Q to suddenly stop conducting. The potential of point A is thus stabilized at the desired precharging voltage Vp a short while after time t2, until the end of the precharging phase at time t3. This time marks the beginning of the read or write phase $\phi 2$, corresponding to the logic state 1 of clock signal $\phi$. This being the case, transistors P1, P3, and N3 are blocked and allow maintenance or discharge of bus 11 depending on the logic state corresponding to bus 11 during the write or read phase.

It should be noted that conduction of transistor N2 between times t2 and t3 contributes to discharging the base of bipolar transistor Q during its interruption period. Transistor N1 could thus be eliminated. Keeping it can be justified only for reasons of electrostatic discharge outside precharging phase $\phi 1$. Moreover, it is clear that polarization circuit 13 can have a form other than that described, composed of voltage divider N4, P4.

It is also important for the gates of transistors N2 and P2 to be connected to output C of amplifier 12. If, for example, the gate of transistor N2 were connected to point A, the gradual potential rise at this point starting at time t1 would make transistor N2 more and more conductive. Hence, an increasing proportion of the current passing through transistors P1 and P2 would be diverted to ground, so that transistor Q would become less and less conductive. The result would be a far longer precharging time t2-t1. Complex additional circuitry would be necessary to cut down this time. The precharging device according to the invention offers the advantage of being very simple and achieving a very short precharging time.

It should be noted that the presence of four transistors N3, P3 and N4, P4 is not necessary. In their absence, threshold Ta could be adjusted to the desired precharging voltage Vp. The four additional transistors offer the advantage of ensuring good operating stability of precharging circuit 10 and precharging voltage Vp.

Other modifications will occur to those skilled in the art without departing from the spirit and the scope of the invention as claimed. Accordingly, the above description is not intended to limit the invention except as indicated in the following claims.

What is claimed is:

1. A precharging circuit for use with a memory bus comprising:
   a bipolar transistor (Q) driven by a clock signal ($\phi$), wherein the base (B) of said bipolar transistor (Q) is connected to two supply potentials through two respective field effect transistors of complementary types (N2, P2) whose gates are connected to the output of a threshold amplifier (12) connected to the bus (11), the clock signal ($\phi$) activating a third field effect transistor (P1), and a drain-source lead being connected in series with the field effect transistor (P2) of said two respective field effect transistors of complementary types (N2, P2).

2. The circuit of claim 1 wherein the value of a threshold Ta of said threshold amplifier (12) is slightly less than a desired precharging voltage Vp of the bus (11).

3. The circuit of claim 1 wherein the clock signal ($\phi$) causes a fourth field effect transistor (N1) to conduct, and the drain-source lead of said transistor is connected in parallel with that of the other field effect transistor (N2) of said two respective field effect transistors of complementary types (N2, P2).

4. The circuit of claim 1 wherein bus (11) is connected to a polarization circuit (13) that is controlled by the clock signal ($\phi$) and is adjusted to the desired precharging voltage Vp of the bus (11).

5. The circuit of claim 4 wherein the polarization circuit (13) includes a voltage divider (N4, P4) that furnishes a polarization voltage adjusted to the desired precharging voltage Vp of the bus (11).

6. The circuit of claim 4 wherein the polarization circuit (13) includes two field effect transistors of complementary types (N4, P4) connected as diodes, the sizes of said transistors being selected relative to one another so as to adjust the polarization voltage to the desired precharging voltage Vp of bus (11).

7. The circuit of claim 6 wherein the two transistors (N4, P4) connected as diodes of the polarization circuit (13) are connected in series between the two supply potentials with the two complementary field effect transistors (N3, P3) controlled by the direct and complementary forms of the clock signal ($\phi$), respectively.

* * * * *